(12) United States Patent
Park

(10) Patent No.: US 11,953,860 B2
(45) Date of Patent: Apr. 9, 2024

(54) SYSTEM AND METHOD OF ESTIMATING VEHICLE BATTERY CHARGING TIME USING BIG DATA

(71) Applicants: HYUNDAI MOTOR COMPANY, Seoul (KR); KIA MOTORS CORPORATION, Seoul (KR)

(72) Inventor: Hyun Soo Park, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 865 days.

(21) Appl. No.: 17/011,521

(22) Filed: Sep. 3, 2020

(65) Prior Publication Data

US 2021/0325833 A1 Oct. 21, 2021

(30) Foreign Application Priority Data

Apr. 21, 2020 (KR) .................. 10-2020-0047968

(51) Int. Cl.
*G04F 10/00* (2006.01)
*B60L 53/62* (2019.01)
(Continued)

(52) U.S. Cl.
CPC .............. *G04F 10/00* (2013.01); *B60L 53/62* (2019.02); *B60L 53/66* (2019.02); *B60L 58/12* (2019.02);
(Continued)

(58) Field of Classification Search
CPC .......... G04F 10/00; B60L 53/62; B60L 53/66; B60L 58/12; B60L 2260/58;
(Continued)

(56) References Cited

U.S. PATENT DOCUMENTS

| | | | |
|---|---|---|---|
| 6,850,898 B1 * | 2/2005 | Murakami | B60L 53/65 705/13 |
| 11,547,592 B1 * | 1/2023 | McGrath | A61F 5/3753 |
| 11,571,983 B2 * | 2/2023 | Lu | B60L 53/67 |
| 11,639,115 B2 * | 5/2023 | Yoon | B60L 3/0023 320/109 |

(Continued)

FOREIGN PATENT DOCUMENTS

| | | |
|---|---|---|
| JP | 4587975 | 11/2010 |
| JP | 2012-135148 | 7/2012 |

(Continued)

*Primary Examiner* — Stacy Whitmore
(74) *Attorney, Agent, or Firm* — Fox Rothschild LLP

(57) ABSTRACT a system for estimating a vehicle battery charging time using big data is provided. The system may include a big-data server configured to collect a charge-related parameter of a battery in a vehicle from a plurality of vehicles, to group the plurality of vehicles into a plurality of groups based on the collected charge-related parameter, and to calculate and transmit a first estimated charging time of a group to which the vehicle belongs during vehicle charging, and a controller installed in each of the plurality of vehicles, and configured to calculate a second estimated charging time based on a state of the battery in the vehicle while the corresponding battery in the vehicle is charged and to calculate a final estimated charging time of the battery by combining the first estimated charging time and the second estimated charging time.

10 Claims, 2 Drawing Sheets

Figure 1:
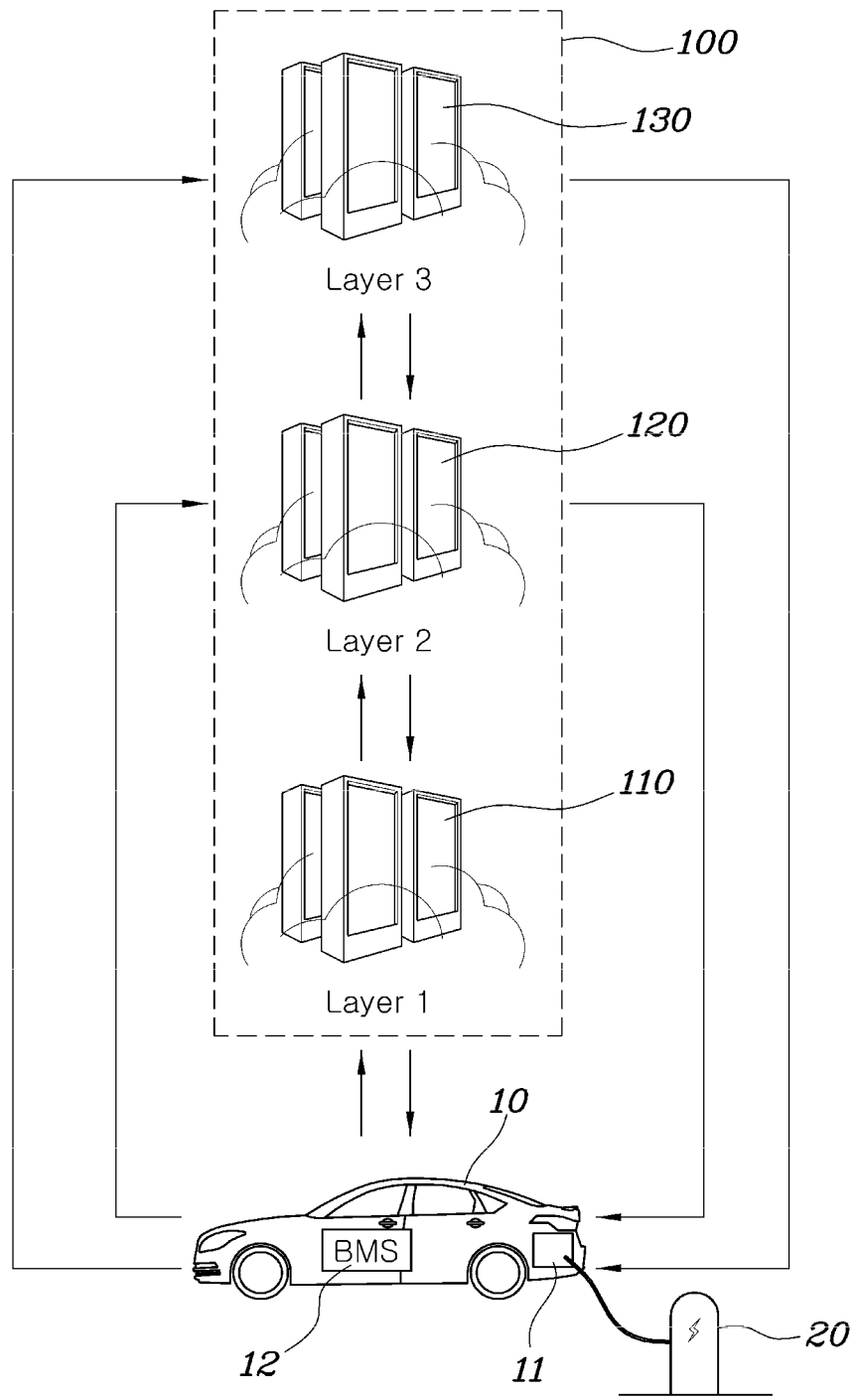

(51) Int. Cl.
*B60L 53/66* (2019.01)
*B60L 58/12* (2019.01)
*G01R 31/36* (2020.01)
*G01R 31/367* (2019.01)
*G01R 31/382* (2019.01)
*H02J 7/00* (2006.01)

(52) U.S. Cl.
CPC ....... *G01R 31/3648* (2013.01); *G01R 31/367* (2019.01); *G01R 31/382* (2019.01); *H02J 7/00032* (2020.01); *H02J 7/0071* (2020.01)

(58) Field of Classification Search
CPC .... B60L 2260/50; B60L 53/665; B60L 58/16; B60L 2260/44; G01R 31/3648; G01R 31/367; G01R 31/382; H02J 7/00032; H02J 7/0071; H02J 7/0047; Y02T 10/70; Y02T 10/7072; Y02T 90/12; Y02T 90/16; G06Q 10/04; G06Q 50/30; B60Y 2200/91
See application file for complete search history.

(56) References Cited

U.S. PATENT DOCUMENTS

| | | | | |
|---|---|---|---|---|
| 2012/0280653 | A1* | 11/2012 | Prosser | B60L 53/305 320/109 |
| 2015/0367740 | A1* | 12/2015 | McGrath | B60L 53/64 320/137 |
| 2019/0118655 | A1* | 4/2019 | Grimes | B60L 58/10 |
| 2019/0135134 | A1* | 5/2019 | Marcial-Simon | B60L 53/64 |
| 2019/0168633 | A1* | 6/2019 | Marcial-Simon | B60L 53/305 |
| 2022/0114351 | A1* | 4/2022 | McGrath | G06K 7/0021 |
| 2022/0211936 | A1* | 7/2022 | Beguin | A61M 5/3293 |
| 2023/0192063 | A1* | 6/2023 | Cronin | H02J 7/345 701/22 |

FOREIGN PATENT DOCUMENTS

| | | | |
|---|---|---|---|
| JP | 2019-021003 | 2/2019 | |
| KR | 10-2014-0048613 | 4/2014 | |
| KR | 10-2017-0010968 | 2/2017 | |
| KR | 10-2017-0068714 | 6/2017 | |
| WO | WO-2013045449 A2 * | 4/2013 | ............. B60L 53/14 |

* cited by examiner

SYSTEM AND METHOD OF ESTIMATING VEHICLE BATTERY CHARGING TIME USING BIG DATA

CROSS-REFERENCE TO RELATED APPLICATION

The present application claims priority to and the benefit of Korean Patent Application No. 10-2020-0047968, filed on Apr. 21, 2020, the disclosure of which is incorporated herein by reference in its entirety.

TECHNICAL FIELD

The present disclosure relates to a system and method of estimating a vehicle battery charging time using big data, and more particularly to a system and method of estimating a vehicle battery charging time using big data for estimating a vehicle battery charging time using big data obtained from a big-data server.

BACKGROUND

The statements in this section merely provide background information related to the present disclosure and may not constitute prior art.

In general, an eco-friendly vehicle produces power by driving a motor using electric energy stored in a battery. The eco-friendly vehicle needs to charge a battery to store sufficient electric energy for producing power of the vehicle.

A method of charging a battery includes a slow charging method of converting alternating current (AC) provided from the outside into direct current (DC) using an on-board charger mounted in a vehicle and applying the converted current to a battery, and a quick charging method of directly receiving DC from the outside and applying the received DC to the battery without a separate conversion procedure.

Irrespective of the battery charging method, it is very important to accurately estimate the time taken to sufficiently charge a battery for driving a vehicle when a vehicle operable time is estimated and determined.

A conventional method of estimating a charging time of a vehicle battery is achieved by estimating the charging time of the battery via a simple computation that is performed by an in-vehicle controller (e.g., a battery management system (BMS)) using parameters related to the battery itself, such as the temperature of the battery or the state of charge (SoC) of the battery, and initial charging power provided from external charging equipment.

In such a conventional method, an in-vehicle controller is capable of estimating a charging time based only on the initial charging power of charging equipment, and thus it is not possible to apply parameters that vary while charging. Thus, the conventional charging-time estimation method has a problem in that a large error between the actual charging time and the estimated charging time inevitably occurs.

It will be understood that the above matters described in the related art are merely for promotion of understanding of the background of the disclosure and should not be recognized as prior art well-known to those skilled in the art.

SUMMARY

Therefore, the present disclosure provides a system for estimating a vehicle battery charging time using big data, which statistically estimates an estimated charging time of a corresponding vehicle by collecting parameters that affect determination of a charging time using a big-data server and processing analysis and statistics of the collected parameters and reduces an error between the estimated charging time and actual charging time via comparison therebetween.

In accordance with an aspect of the present disclosure, the above and other objects can be accomplished by the provision of a system for estimating a vehicle battery charging time using big data including a big-data server configured to collect a charge-related parameter of a battery in a vehicle from a plurality of vehicles, to group the plurality of vehicles into a plurality of groups based on the collected charge-related parameter, and to calculate and transmit a first estimated charging time of a group to which the vehicle that is a charging target belongs during vehicle charging, and a controller installed in each of the plurality of vehicles, and configured to calculate a second estimated charging time based on a state of the battery in the vehicle while the corresponding battery in the vehicle is charged and to calculate a final estimated charging time of the battery by combining the first estimated charging time and the second estimated charging time.

The big-data server may group vehicles having similar charging environments or similar charging patterns into one group based on the collected charge-related parameter.

The big-data server may store an algorithm or a table for deriving an estimated charging time depending on the charge-related parameter for each of the plurality of groups, may receive the charge-related parameter from the vehicle that is the charging target during vehicle charging, may derive the first estimated charging time of the vehicle that is the charging target by applying the received charge-related parameter to an algorithm or a table for the group to which the vehicle that is the charging target belongs, and may transmit the derived first estimated charging time.

While the corresponding battery in the vehicle is charged, the controller may transmit charge-related data at a time at which charging begins to the big-data server, and may calculate a final estimated charging time of the battery by combining the first estimated charging time derived by the big-data server and the second estimated charging time based on the transmitted charge-related data.

After charging of the battery is terminated, the controller may reset a weight for combining the first estimated charging time and the second estimated charging time according to a result obtained by comparing an actual charging time consumption with the first estimated charging time and the second estimated charging time.

In accordance with another aspect of the present disclosure, there is provided a method of estimating a vehicle battery charging time using big data, including collecting a charge-related parameter of a battery in a vehicle from a plurality of vehicles, by a big-data server, grouping the plurality of vehicles into a plurality of groups based on the collected charge-related parameter, by the big-data server, transmitting charge-related data at a time at which charging begins to the big-data server while the battery in the vehicle is charged, by a controller in a vehicle, which is a charging target, calculating and transmitting a first estimated charging time of a group to which the vehicle that is the charging target belongs based on the charge-related data at a time at which charging begins, by the big-data server, and calculating a second estimated charging time based on a state of the battery and calculating a final estimated charging time of the battery by combining the first estimated charging time received from the big-data server and the second estimated charging time.

The grouping may include grouping vehicles having similar charging environments or similar charging patterns into one group based on the collected charge-related parameter.

The grouping may include storing an algorithm or a table for deriving an estimated charging time depending on the charge-related parameter for each of the plurality of groups.

The transmitting may include receiving the charge-related parameter from the vehicle that is the charging target, deriving the first estimated charging time of the vehicle that is the charging target by applying the received charge-related parameter to an algorithm or a table for the group to which the vehicle that is the charging target belongs, and transmitting the derived first estimated charging time.

The calculating the second estimated charging time may include, after charging of the battery is terminated, resetting a weight for combining the first estimated charging time and the second estimated charging time according to a result obtained by comparing an actual charging time consumption with the first estimated charging time and the second estimated charging time, by the controller.

DRAWINGS

Figure 2:
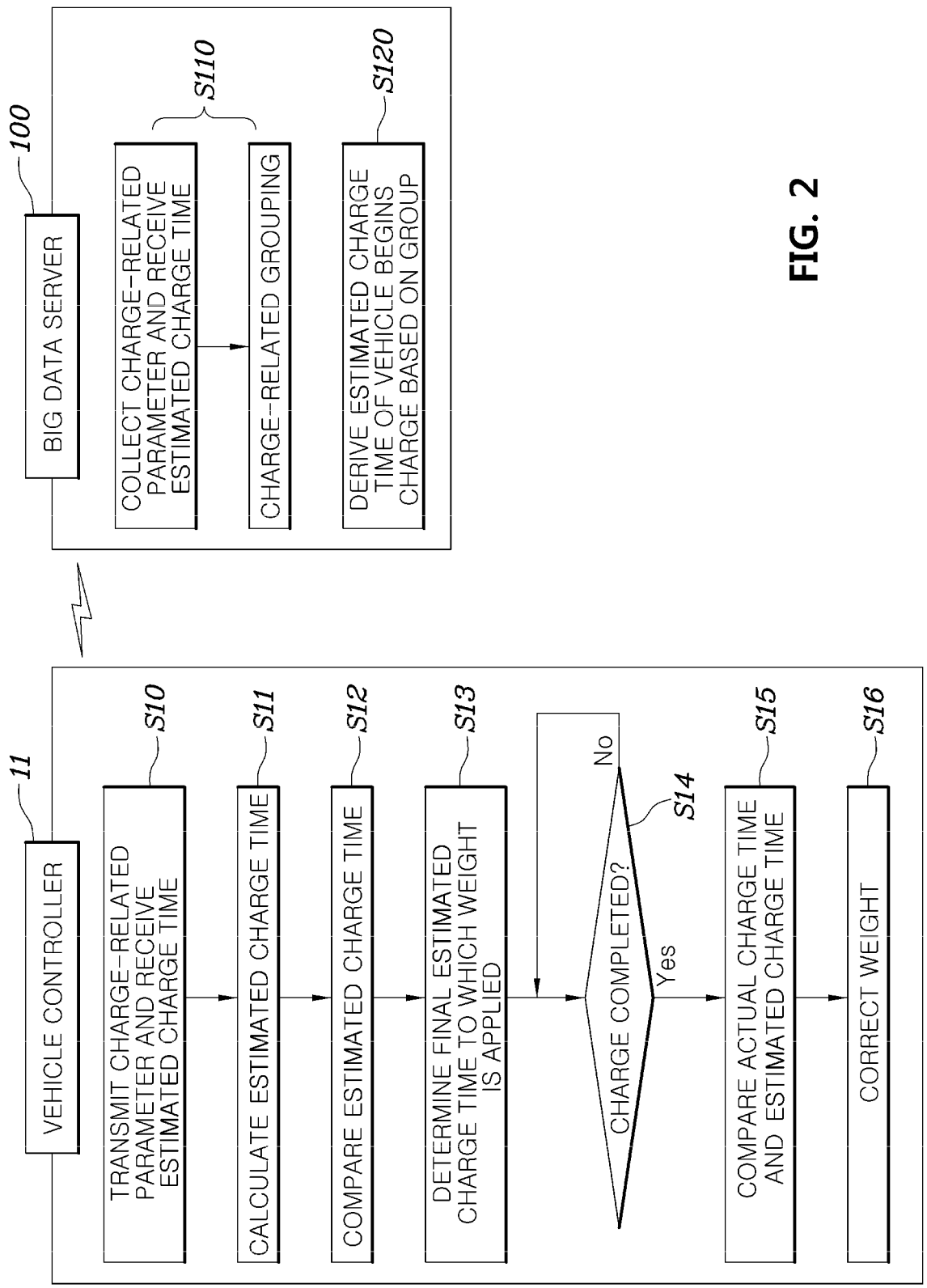

The above and other objects, features and other advantages of the present disclosure will be more clearly understood from the following detailed description taken in conjunction with the accompanying drawings, in which:

FIG. 1 is a diagram illustrating the configuration of the system for estimating a vehicle battery charging time using big data in one form of the present disclosure; and FIG. 2 is a flowchart showing a method of estimating a vehicle battery charging time using big data in one form of the present disclosure.

DETAILED DESCRIPTION

Hereinafter, a system and method of estimating a vehicle battery charging time using big data according to various embodiments of the present disclosure will be described with reference to the accompanying drawings.

FIG. 1 is a diagram illustrating the configuration of the system for estimating a vehicle battery charging time using big data according to an embodiment of the present disclosure.

Referring to FIG. 1, the system for estimating a vehicle battery charging time using big data according to an embodiment of the present disclosure may include a big-data server 100 configured to collect a charge-related parameter of an in-vehicle battery 12 generated by a vehicle 10, to form a plurality of groups for determining an estimated charging time based on the collected charge-related parameter, to determine the group to which a corresponding vehicle belongs while the vehicle is charged, and to transmit a first estimated charging time, dependent upon the determined group, and a controller 11 installed in each of a plurality of vehicles 10 and configured to calculate a second estimated charging time based on the state of a battery while the battery is charged and to calculate a final estimated charging time of the battery 12 by combining the first estimated charging time provided from the big-data server 100 and the calculated second estimated charging time.

The big-data server 100 may receive various parameters related to a processor for charging an in-vehicle battery from the vehicle 10 and may generate and store data obtained by processing and analyzing the received parameter. In particular, the big-data server 100 may generate and store additional parameters related to a battery-charging time based on the parameters received from the vehicle 10 while the battery 12 is charged or secondary data generated using the parameter received from the vehicle 10 and may group a plurality of vehicles based on the parameter received from the vehicle 10, parameters that are autonomously generated, and the like. The grouping is a procedure of forming a plurality of groups by associating vehicles having similar parameter values based on main parameters related to charging in one group.

As shown in FIG. 1, the big-data server 100 may be embodied using a distributed cloud method of a hierarchical structure having cloud servers 110, 120, and 130 for respective layers.

For example, the first-layer cloud server 110, belonging to the lowermost layer of a plurality of hierarchical structures, may communicate with the vehicle 10, may log data generated by the vehicle 10 in real time, and may provide the logged data to the vehicle 10 if necessary, or may provide the data to the cloud servers 120 and 130 belonging to a high-ranking layer of the lowermost layer 110.

The first-layer cloud server 110 may log raw data generated by a vehicle in real time via communication with the vehicle. The first-layer cloud server 110 may log and store vehicle data at a low sampling rate as possible without data loss. The first-layer cloud server 110 may set a limit on the amount of data to be logged and stored per vehicle, that is, the communication target. Needless to say, if resources allow, all data logged from a vehicle may be stored, but the first-layer cloud server 110 communicates with the vehicle mainly in real time, and thus the amount of data to be stored per vehicle may be limited in order to use resources effectively.

The raw data logged by the first-layer cloud server 110 may be data that is generated and transmitted by various controllers of a vehicle. In particular, in calculation of a battery charging time according to an embodiment of the present disclosure, the first-layer cloud server 110 may directly receive various charge-related parameters from the vehicle 10 and may classify parameters to be used to calculate other factors related to battery charging. Real-time data provided to the first-layer cloud server 110 from the vehicle 10 may be data related to charging of the battery 12 installed in the vehicle, and the charge-related parameter of the battery 12 may be, for example, a vehicle type, a state of health (SoH) of a battery, a temperature of the battery when charging begins, a temperature of the environment around the battery, the maximum power of external charging equipment 20 for providing charging power, an area in which the external charging equipment 20 is installed, the manufacturer of the external charging equipment 20, the time range in which charging begins, the required charging amount, or the charging time taken to actually charge the battery.

The big-data server 100 may collect the aforementioned charge-related parameter from a plurality of vehicles, may group vehicles having similar charging environments or patterns based on the collected parameters, and may then write and store a charging-time estimation algorithm or a charging-time estimation table for each group. The grouping result or the charging-time estimation algorithm or the charging-time estimation table for each group may be derived by a high-ranking cloud server such as the second- and third-layer cloud servers 120 and 130.

Then, the big-data server 100 may search for a group to which a corresponding vehicle belongs while a vehicle is being charged, and may estimate a charging time consumption by applying charge-related parameters provided from the vehicle that is a charging target to the charging-time estimation algorithm or the charging-time estimation table for the found group. For example, when charging begins, the vehicle may transmit the charge-related parameter to the first-layer cloud server 110, the first-layer cloud server 110 may provide the received parameter to the second- or third-layer cloud server 120 or 130, and the second- or third-layer cloud server 120 or 130 may calculate an estimated charging time (hereinafter, the estimated charging time calculated by a big-data server is referred to as a 'first estimated charging time') by applying the received charge-related parameter to a stored algorithm or table for deriving the estimated charging time and may then transmit the calculated estimated charging time to the controller 11 of the vehicle 10.

FIG. 1 is a diagram for explaining an example of an embodiment in which a total of three layers is embodied, and the number of layers may be appropriately adjusted as necessary.

When a vehicle is electrically connected to the external charging equipment 20 and charging begins, the controller 11 installed in the vehicle 10 may recognize data related to battery charging and may provide the data to the big-data server 100. The controller 11 may calculate an estimated charging time (hereinafter, the estimated charging time calculated by the controller 11 of the vehicle 10 is referred to as a 'second estimated charging time') of the battery 12 using a pre-embedded algorithm for calculating an estimated charging time. As the algorithm for calculating the estimated charging time of the battery, various algorithms that are known in the art to which the present disclosure pertains may be applied.

The controller 11 may calculate a final estimated charging time by combining the first estimated charging time, calculated based on the algorithm or the table stored in association with the group to which the vehicle belongs by the big-data server 100, which receives the charge-related parameter transmitted during charging and the second estimated charging time, which is directly calculated.

The controller 11 may calculate the final estimated charging time by applying respective preset weights to the first estimated charging time and the second estimated charging time.

When charging is terminated, the controller 11 may compare the actual charging time consumption with the final estimated charging time, calculated when charging begins, and may adjust the weight used to calculate the final estimated charging time based on the comparison error.

FIG. 2 is a flowchart showing a method of estimating a vehicle battery charging time using big data according to an embodiment of the present disclosure. The operation and operational effect of the system for estimating a vehicle battery charging time using big data having the configuration described above will be more clearly understood from a description of the method of estimating a vehicle battery charging time using big data according to an embodiment of the present disclosure.

Referring to FIG. 2, when the vehicle 10 is electrically connected to the external charging equipment 20 that provides charging power and then charging begins, the controller 11 may transmit a charge-related parameter in the current state to the big-data server 100 (S10).

The big-data server 100 may pre-collect charge-related parameters from a plurality of vehicles and may group vehicles having similar charging environments or similar charging patterns into one group based on the charge-related parameters (S110). The big-data server 100 may cumulatively store charge-related data, transmitted from a vehicle during charging, and may group a plurality of vehicles into one group based on the stored charge-related data. For example, on the assumption that grouping is performed based on the position of a charger and the lifetime of a vehicle battery among vehicle charge-related data, vehicles having similar battery lifetimes among vehicles that mainly use similar chargers may be grouped into one group.

In the grouping S110, the big-data server 100 may derive and store a calculation algorithm or a table for calculating an estimated charging time for a corresponding group. In this case, the big-data server 100 may use a statistical method. For example, when the big-data server 100 has performed grouping based on the position of a charger and the lifetime of a vehicle battery, the big-data server 100 may derive the first estimated charging time by using a state of charge (SoC) at charging start and an average charging time according to a battery temperature of vehicles that have used chargers for the corresponding group and have battery life times for the corresponding group. In order to calculate the estimated charging time, the big-data server 100 may pre-store the algorithm or a table for deriving the average charging time depending on the SoC at charging start and the average charging time according to the battery temperature of the vehicles that have used the chargers for the corresponding group and have the battery life times for the corresponding group.

In operation S10, when receiving a charge-related parameter at the time at which current charging begins from the controller 11 of the vehicle 10 for which charging begins, the big-data server 100 may derive the first estimated charging time by applying the received charge-related data to an algorithm or a table which is pre-stored for the group to which the corresponding vehicle belongs, and may transmit the first estimated charging time to the controller 11 of the vehicle 10 (S120).

The controller 11 of the vehicle 10 may calculate the second estimated charging time by applying a preset algorithm or the like based on the charge-related parameter at the time at which charging begins (S11). As an algorithm for calculating the estimated charging time of a battery based on charge-related parameters (e.g., a battery temperature, a battery SoC, or charging power provided from charging equipment) of the battery 12 by the controller 11 in the vehicle while charging the battery, various algorithms that are known in the art to which the present disclosure pertains may be applied.

Then, the controller 11 may calculate a final estimated charging time by combining the calculated second estimated charging time and the first estimated charging time, received from the big-data server 100 (S13).

For example, the controller 11 may calculate the final estimated charging time using the following equation by multiplying the first estimated charging time and the second estimated charging time by respective weights and then summing the results.

$$T_{EST\_FINAL} = \alpha \cdot T_{EST\_1} + (1-\alpha) \cdot T_{EST\_2} \quad \text{[Equation]}$$

Here, $T_{EST\_FINAL}$ is a final estimated charging time, $T_{EST\_1}$ is a first estimated charging time, $T_{EST\_2}$ is a second estimated charging time, and $\alpha$ is a weight equal to or greater than 0 and equal to or less than 1.

Then, when charging of the battery 12 is terminated, the controller 11 may compare the actual charging time consumption with the first estimated charging time and the second estimated charging time, which are received and calculated when charging begins (S15), and may change the values of the weights (S16). For example, in an example in which the final estimated charging time is determined as shown by the aforementioned equation, when the actual charging time consumption is a value closer to the second estimated charging time than the first estimated charging time, the weight a may be reduced, and when the actual charging time consumption is a value closer to the first estimated charging time than the second estimated charging time, the weight a may be increased. As such, the changed weight may be applied to calculate an estimated charging time when charging is next performed.

As described above, in the system and method of estimating a vehicle battery charging time using big data according to various embodiments of the present disclosure, a big-data server may receive a charge-related parameter from a vehicle during actual vehicle charging and may statistically estimate an estimated charging time of a corresponding vehicle by processing analysis and statistics of the accumulated charge-related parameters received from a plurality of vehicles, and an in-vehicle controller may compare the calculated estimated charging time with the estimated charging time estimated by the big-data server and may reduce an error between the two values.

Accordingly, charge-related parameters that are provided by a vehicle in order to derive an estimated charging time during charging are accumulated in a big-data server and information on an error between the actual charging time consumption and the calculated estimated charging time is accumulated, thereby improving the accuracy of charging time estimation. It may be possible to reflect aging of a charger for each area as well as aging of a battery in the calculation of an estimated charging time by the big-data server, and thus an optimum estimated charging time may be derived depending on a charging pattern and the residential district of a customer.

In the system for estimating a vehicle battery charging time using big data, a big-data server may receive a charge-related parameter from a vehicle during actual vehicle charging and may statistically estimate an estimated charging time of the corresponding vehicle by processing analysis and statistics of the accumulated charge-related parameters received from a plurality of vehicles, and an in-vehicle controller may compare the calculated estimated charging time with the charging time estimated by the big-data server and may reduce the error between the two values.

Accordingly, in the system for estimating a vehicle battery charging time using big data, charge-related parameters that are provided by a vehicle in order to derive an estimated charging time during charging are accumulated in a big-data server and information on an error between the actual charging time consumption and the calculated estimated charging time is accumulated, thereby improving the accuracy of charging time estimation.

In addition, in the system for estimating a vehicle battery charging time using big data, it may be possible to reflect aging of a charger for each district as well as aging of a battery in the calculation of an estimated charging time by the big-data server, and thus an optimum estimated charging time may be derived depending on the charging pattern and the residential district of a customer, thereby providing a more accurate estimated charging time to a vehicle driver and improving the marketability of the vehicle.

It will be appreciated by those skilled in the art that the effects achievable through the present disclosure are not limited to those that have been particularly described hereinabove and that other unmentioned effects of the present disclosure will be more clearly understood from the above detailed description.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A system for estimating a vehicle battery charging time using big data, comprising:
   a big-data server configured to:
      collect a charge-related parameter of a battery in a vehicle from a plurality of vehicles, to group the plurality of vehicles into a plurality of groups based on the collected charge-related parameter; and
      calculate and transmit a first estimated charging time of a group to which the vehicle that is a charging target belongs during vehicle charging; and
   a controller installed in each of the plurality of vehicles, and configured to:
      calculate a second estimated charging time based on a state of the battery in the vehicle while the corresponding battery in the vehicle is charged; and
      calculate a final estimated charging time of the battery by combining the first estimated charging time and the second estimated charging time,
   wherein in response to charging of the battery being terminated, the controller is configured to:
      reset a weight for combining the first estimated charging time and the second estimated charging time based on an actual charging time consumption.

2. The system of claim 1, wherein the big-data server is configured to:
   group vehicles having similar charging environments or similar charging patterns into one group based on the collected charge-related parameter.

3. The system of claim 1, wherein the big-data server is configured to:
   store an algorithm or a table for deriving an estimated charging time depending on the charge-related parameter for each of the plurality of groups;
   receive the charge-related parameter from the vehicle that is the charging target during vehicle charging;
   derive the first estimated charging time of the vehicle that is the charging target by applying the received charge-related parameter to an algorithm or a table for the group to which the vehicle that is the charging target belongs; and
   transmit the derived first estimated charging time.

4. The system of claim 1, wherein, while the corresponding battery in the vehicle is charged, the controller is configured to:
   transmit charge-related data at a time at which charging begins to the big-data server; and
   calculate a final estimated charging time of the battery by combining the first estimated charging time derived by the big-data server and the second estimated charging time based on the transmitted charge-related data.

5. The system of claim 1, wherein
   the weight for combining the first estimated charging time and the second estimated charging time is obtained by comparing the actual charging time consumption with the first estimated charging time and the second estimated charging time.

6. A method of estimating a vehicle battery charging time using big data, the method comprising:
- collecting, by a big-data server, a charge-related parameter of a battery in a vehicle from a plurality of vehicles;
- grouping, by the big-data server, the plurality of vehicles into a plurality of groups based on the collected charge-related parameter;
- transmitting, by a controller in a vehicle, charge-related data at a time at which charging begins to the big-data server while the battery in the vehicle is charged;
- calculating and transmitting, by the big-data server, a first estimated charging time of a group to which the vehicle belongs based on the charge-related data at the time at which charging begins;
- calculating a second estimated charging time based on a state of the battery; and
- calculating a final estimated charging time of the battery by combining the first estimated charging time received from the big-data server and the second estimated charging time,
- wherein calculating the second estimated charging time comprises:
  - in response to charging of the battery being terminated, resetting, by the controller, a weight for combining the first estimated charging time and the second estimated charging time based on an actual charging time consumption.

7. The method of claim 6, wherein grouping the plurality of vehicles comprises:
- grouping vehicles having similar charging environments or similar charging patterns into one group based on the collected charge-related parameter.

8. The method of claim 6, wherein grouping the plurality of vehicles comprises:
- storing an algorithm or a table to derive an estimated charging time depending on the charge-related parameter for each of the plurality of groups.

9. The method of claim 8, wherein transmitting the charge-related data comprises:
- receiving the charge-related parameter from the vehicle;
- deriving the first estimated charging time of the vehicle by applying the received charge-related parameter to an algorithm or a table for the group to which the vehicle belongs; and
- transmitting the derived first estimated charging time.

10. The method of claim 6, wherein
- the weight for combining the first estimated charging time and the second estimated charging time is obtained by comparing the actual charging time consumption with the first estimated charging time and the second estimated charging time.

* * * * *